United States Patent [19]

Millhollan et al.

[11] 4,027,285
[45] May 31, 1977

[54] DECODE CIRCUITRY FOR BIPOLAR RANDOM ACCESS MEMORY

[75] Inventors: Michael S. Millhollan, Mesa; Ronald L. Treadway, Scottsdale, both of Ariz.

[73] Assignee: Motorola, Inc., Chicago, Ill.

[22] Filed: May 2, 1975

[21] Appl. No.: 574,076

Related U.S. Application Data

[62] Division of Ser. No. 428,511, Dec. 26, 1973, now Defensive Publication No. 3,914,620.

[52] U.S. Cl. .................. 340/166 R; 340/173 R; 307/237
[51] Int. Cl.² ............... G11C 8/00; H03K 5/20; H04Q 9/00
[58] Field of Search .......... 307/243, 237, 215, 218, 307/270; 340/166 R, 173 R, 173 SP, 173 FF

[56] References Cited

UNITED STATES PATENTS

| | | | |
|---|---|---|---|
| 3,651,344 | 3/1972 | O'Shea | 307/270 |
| 3,721,964 | 3/1973 | Barrett et al. | 340/166 R |
| 3,737,859 | 6/1973 | Kadow | 340/166 R |
| 3,742,250 | 6/1973 | Kan | 307/237 |
| 3,806,880 | 4/1974 | Spence | 340/166 FE |
| 3,824,580 | 7/1974 | Bringol | 340/166 EL |

*Primary Examiner*—Donald J. Yusko
*Attorney, Agent, or Firm*—Charles R. Hoffman

[57] ABSTRACT

An N-bit binary address decoder suitable for use in an emitter-coupled logic bipolar random access memory (RAM) is provided. Each of the N address input signals is applied to an input terminal and is level shifted and applied to the input node of an emitter-coupled logic inverter. The outputs of the emitter-coupled logic inverter are the collectors of the emitter-coupled transistors on which complementary output signals representative of the corresponding binary address input signal are produced. The complementary output signals generated by the N inverters are connected to $2^N$ AND gates to form the possible $2^N$ minterm combinations. Each of the AND gates includes a load resistor coupled to a power supply and N Schottky diodes having their anodes coupled to the load resistor and their cathodes coupled to the corresponding address inverter output terminals. The anodes of the input diodes of each AND gate are also connected to the base of a transistor, the emitter of which produces the signal representing the corresponding minterm function generated by that AND gate.

1 Claim, 1 Drawing Figure

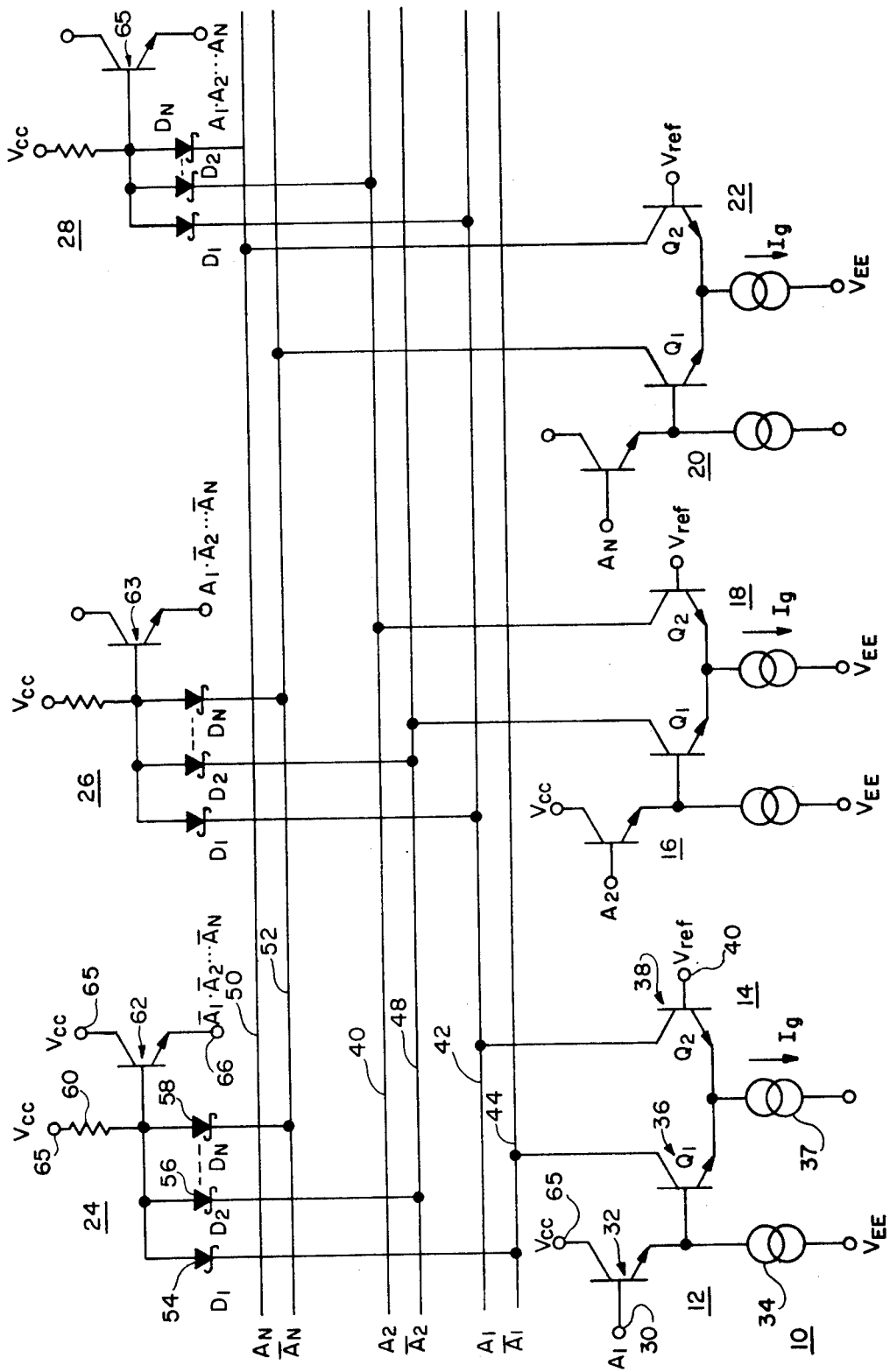

DECODE CIRCUITRY FOR BIPOLAR RANDOM ACCESS MEMORY

This is a division, of application Ser. No. 428,511, Dec. 26, 1973, now U.S. Pat. No. 3,914,620.

BACKGROUND OF THE INVENTION

Previous decoding circuits for emitter-coupled logic (ECL) memory required two "levels" of standard ECL gating to form the OR/NOR implementation of the address minterms. (A minterm of N variables is a Boolean product of these N variables, with each variable present in either its true or its complemented form.) In the logic circuitry previously used to decode the binary address inputs to an ECL memory, the address inputs are applied directly to ECL inverter circuits having load resistors connected between the collectors of the emitter-coupled transistors and the positive power supply conductor. This causes one stage of the delay of the decoding circuit. The differential collector outputs are coupled to the bases of emitter follower output transistors having multiple emitters. The multiple emitters from each address inverter are then emitter OR'ed (i.e., connected together) with the output emitters of the emitter followers of the other address inverters to provide the possible maxterms. (A number of N variables is a Boolean sum of these N variables, where each variable is present in either its true or its complemented form.) The maxterm nodes thus formed are than coupled to, respectively, $2^N$ emitter coupled logic inverters to provide the $2^N$ minterm functions, which provide the decoded outputs. Here N is the number of address inverters in the group. Because of circuit constraints and topological constraints, which reduce circuit speed, the maximum size of the maxterm groups is usually limited to three address input variables. The outputs of the "OR'ed" combination groups are provided as inputs to multiple input NOR gates, and the output is used to drive the selected memory row or column.

SUMMARY OF THE INVENTION

It is an object of this invention to provide a circuit which provides a high speed AND function and a circuit which provides a high speed OR function.

Another object of the invention is to provide a decode circuit function requiring only one gate delay.

It is another object of the invention to provide a high speed decode system for an emitter-coupled logic random access memory.

It is another object of the invention to provide a high speed emitter-coupled logic decode gate requiring a reduced number of components and a dissipating reduced amount of power.

It is another object of the invention to provide a decode circuit by coupling an output of an emmitter-coupled logic current switch to an input of diode logic AND gate.

Briefly described, the invention provides an N-input high speed emitter-coupled logic decoder for selecting one out of $2^N$ combinations of N variables which include N emitter-coupled logic inverters each including first and second emitter-coupled transistors and a current source connected to the coupled emitters. Complementary output signals are provided, respectively, at the collectors of the first and second transistors. The decoder also includes $2^N$ N-input diode AND gates, each having an emitter follower output transistor connected thereto. The N complementary outputs of the N emitter-coupled logic inverters are connected to the various cathodes of the diodes to form the $2^N$ possible minterm combinations. The emitter follower outputs may then be used to drive row selection circuitry of column selection circuitry of an ECL random access memory array.

BRIEF DESCRIPTION OF THE DRAWING

FIG. 1 is a schematic diagram of an N-bit decoder circuit according to the invention.

DESCRIPTION OF THE INVENTION

FIG. 1 is a schematic diagram of a decoder circuit suitable for selecting rows or columns of an array of random access memory (RAM) storage cells. Referring to the Figure, decoder 10 includes N-input buffer circuits including circuits 12, 16 and 20, each of which are emitter followers. Each of the emitter followers has its output coupled to the input of an emitter-coupled logic (ECL) inverter circuits. ECL inverter circuit 14, has its input connected to the output of emitter follower 12, inverter circuit 18 has its input connected to the output of emitter follower 16, and inverter 22 has its input connected to the output of emitter follower 20.

Each of the inverters 14, 18 and 22 produce complementary output signals at the collectors of their emitter-coupled transistors. Decoder 10 also includes N AND gates including AND gates 24, 26 and 28, each of which has N-input diodes having their anodes connected together and coupled to one terminal of a load resistor, the opposite terminal of which is coupled to a $V_{CC}$ supply voltage conductor 65. AND gates 24, 26 and 28 include, respectively, output driver transistors 62, 63 and 65, the emitters of which each provide one of $2^N$ combinations of the N-input variables $A_0, A_1 \ldots A_N$.

The structure of one of the input buffers, one of the address inverters, and one of the ANd gates will now be described in detail. The structures of the remaining gates, buffers and inverters, are entirely similar.

Emitter follower 12 includes transistors 32 which has its collector connected to $V_{CC}$ conductor 65, its base connected to address input conductor 30 and its emitter connected to current source 34. Address inverter 14 includes transistors 36 and 38 having their emitters coupled together to current source 37. Transistor 36 has its base connected to the emitter of emitter follower transistor 32 and its collector connected to $\overline{A}_1$ conductor 44. Transistor 38 has its base connected to reference voltage conductor 40 and its collector connected to $A_1$ conducter 42. Similarly, the collectors of the emitter-coupled transistors of address inverter 18 are connected to $A_2$ conductor 48 and $\overline{A}_2$ conductor 46. The collectors of te emitter-coupled transistors of address inverter 22 are, respectively, coupled to $\overline{A}_N$ conductor 52 and $A_N$ conductor 50.

AND gates 24 includes Schottky diodes 54, 56 and 58 having their anodes connected together to one terminal of load resistor 60, the other terminal of which is connected to $V_{cc}$ conductor 65. The anodes of Schottky diodes 54, 56 and 58 are connected to the base of emitter follower output transistor 62, which has its collectors connected to $V_{CC}$ conductor 65 and its emitter connected to output conductor 66. (The emitter load circuit coupled to the emmitter follower transistor is not shown.) Diode 54 has its cathode connected to $\overline{A}_1$ conductor 44, diode 56 has its cathode connected to $\overline{A}_2$ conductor 48, and diode 58 has its cathode connected to $\overline{A}_N$ conductor 52. Hence, the voltage on output conductor 66 represents the minterm combinations $\overline{A}_1, \overline{A}_2 \ldots \overline{A}_N$. Similarly, the cathodes of the input diodes of the other AND gates are connected to the various other possible combinations of the address and address complement conductors.

The operation of the circuit depicted in the Figure may be described by considering the operation for the case wherein all of the address input signals $A_1, A_2 \ldots A_N$ are at a logical O level, i.e., at a relatively low voltage level. It is assumed for this discussion that $V_{CC}$ is at ground potential, $V_{EE}$ is at −5.2 volts, a logical O is −1.6 volts, a logical 1 is −0.8 volts, and $V_{REF}$ (the reference voltage) is at −1.2 volts. Then, for each of the emitter followers 12, 16, and 20, the output voltage will be approximately −2.4 volts, causing $Q_1$ of the corresponding address inverter to be off. The current $I_G$ for each of the address inverters will thus be flowing through $Q_2$. Thus, part of the current $I_G$ of inverter 14 will flow through diode $D_1$ of diode AND gate 26, tending to turn transistor 63 off. (The current $I_G$ of inverter 14 splits among all diodes $D_1$, some of which are not shown, connected to $\overline{A}_1$ conductor 44). Part of $I_G$ of inverter 18 will flow through diode $D_2$ of diode AND gate 28, thereby tending to turn transistor 65 off. Diode AND gates 26 and 28 are thereby unselected. However, no current (except negligible leakage currents) flow through diodes $D_1, D_2 \ldots D_N$ of diode AND gate 24. Therefore, all of the current through resistor 60 flows into the base of transistor 62 causing diode AND gate 24 to be selected, the voltage on the emitter of output transistor 62 representing the minterm combination $\overline{A}_1, \overline{A}_2 \ldots \overline{A}_N$. Other combinations of the input variables $A_1, A_2 \ldots A_N$ each result in the selection of one and only one of the other diode AND gates.

The speed of operation of the above-described decode circuit is extremely fast, and is approximately equivalent to one average ECL gate delay, since the diode ANd gate essentially functions as the load circuitry for the emitter-coupled transistors $Q_1$ and $Q_2$ of the ECL inverters. Thus, the inventive logic circuitry provides one less gate delay than the previously described prior art decoding circuitry. Further, it has been found that the topology of the interconnecting schemes involving the $\overline{A}_1, A_1, \overline{A}_2$, etc. conductors is much more efficient than the interconnection scheme for emitter OR'ing as previously described for the prior art systems. Further, the power dissipation for the present decoder is far less than the prior scheme, since the current which flows through the unselected AND gates also flows through the ECL inverters; in the prior art scheme, the emitter OR'ed conductors representing the various maxterms were limited to approximately three input variables, and a current dissipating inverter and emitter follower had to be provided for each group of three input variables, further increasing power dissipation.

Although any kind of diodes may be used in diode AND gates, use of Schottky diodes is advantageous because of the high speed, high yield, and high density of Schottky diodes.

In summary, the invention provides circuitry which allows easy implementation of large binary address decoders using ECL compatible circuitry. ECL gates coupled with a Schottky diode and decoder results in a very fast decode function which reduces the circuit delay of the entire coding function to that of a single gate. The replacement of many transistors required by the prior art approach and the use of topologically dense Schottky diodes results in a higher circuit yield and reduced die area. The concept of the present invention will find application for binary address decoding in many large bipolar memories and in high speed implementations of the AND and OR functions in ECL random logic circuits.

While the invention has been described with reference to a particular embodiment thereof, those skilled in the art will recognize that variations in arrangement and placement of components may be made to suit various requirements within the scope of the invention.

What is claimed is:

1. In an array of binary storage cells arranged as $2^N$ rows selectable by means of signals applied to N row address inputs and $2^M$ columns selectable by signals applied to M column inputs, M and N being integers, row decode means comprising:

N inverter means, each including a first transistor having its base coupled to a respective one of said row address inputs, and a second transistor having its base connected to a reference voltage conductor, and its emitter connected to the emitter of said first transistor and to a current source, for generating signals representative of the logical complements of said row address input signals at the collectors of said respective first transistors and for generating signals representative of said respective row address input signals at the collectors of said respective second transistors;

$2^N$ gate means coupled to said N inverter means for selecting a different one of said $2^N$ rows, each of said $2^N$ gate means including a. N diodes, each having its anode connected to the anodes of the other of said diodes and to the base of an output transistor and to a load resistor, each of said output resistors having its emitter coupled to a respective one of said rows;

b. each of said diodes having its cathode coupled to one and only one of said collectors, so that signals produced at the bases of each of said output transistors represent, respectively, the $2^N$ combinations of said N row address signals.

* * * * *

Disclaimer 4,027,285.—*Michael S. Millhollan*, Mesa and *Ronald L. Treadway*, Scottsdale, Ariz. DECODE CIRCUITRY FOR BIPOLAR RANDOM ACCESS MEMORY. Patent dated May 31, 1977. Disclaimer filed Sept. 20, 1982, by the assignee, *Motorola, Inc.*

Hereby enters this disclaimer to claim 1 of said patent.
[*Official Gazette November 16, 1982.*]